(12) United States Patent
Miyazawa et al.

(10) Patent No.: US 11,942,350 B2
(45) Date of Patent: Mar. 26, 2024

(54) ELECTROSTATIC CHUCK AND SUBSTRATE HOLDING DEVICE

(71) Applicant: SHINKO ELECTRIC INDUSTRIES CO., LTD., Nagano (JP)

(72) Inventors: Masakuni Miyazawa, Nagano (JP); Mizuki Watanabe, Nagano (JP); Tomohiro Inoue, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 244 days.

(21) Appl. No.: 17/645,521

(22) Filed: Dec. 22, 2021

(65) Prior Publication Data
US 2023/0032111 A1    Feb. 2, 2023

(30) Foreign Application Priority Data

Aug. 2, 2021 (JP) .................. 2021-126602

(51) Int. Cl.
H01L 21/683 (2006.01)
H01J 37/32 (2006.01)

(52) U.S. Cl.
CPC .... H01L 21/6833 (2013.01); H01J 37/32715 (2013.01); *H01J 2237/2007* (2013.01); *H01J 2237/334* (2013.01)

(58) Field of Classification Search
CPC ......... H01L 21/67103; H01L 21/68757; H01L 21/6833; H01J 37/32715; H01J 2237/334; H01J 2237/2007
USPC ....................................................... 361/234
See application file for complete search history.

(56) References Cited

U.S. PATENT DOCUMENTS

2017/0358476 A1    12/2017  Horiuchi et al.
2019/0287840 A1*    9/2019  Katayama ......... H01L 21/67109

FOREIGN PATENT DOCUMENTS

JP    2010123712 A    *  6/2010
JP    2017-218352        12/2017

OTHER PUBLICATIONS

Machine translation of Ishida Japanese Patent Document JP 2010-123712 A Jun. 2010 (Year: 2010).*

* cited by examiner

Primary Examiner — Kevin J Comber
(74) Attorney, Agent, or Firm — IPUSA, PLLC

(57) ABSTRACT

An electrostatic chuck includes a base having a surface on which an object is to be placed, and a through hole extending through the base, wherein a porous material containing angular ceramic particles is disposed in the through hole.

8 Claims, 6 Drawing Sheets

ELECTROSTATIC CHUCK AND SUBSTRATE HOLDING DEVICE

CROSS-REFERENCE TO RELATED APPLICATIONS

The present application is based upon and claims the benefit of priority from the prior Japanese Patent Application No. 2021-126602 filed on Aug. 2, 2021, with the Japanese Patent Office, the entire contents of which are incorporated herein by reference.

FIELD

The disclosures herein relate to electrostatic chucks and substrate holding devices.

BACKGROUND

A film deposition apparatus (e.g., a chemical vapor deposition apparatus, a physical vapor deposition apparatus, or the like) and a plasma etching apparatus are used in the process of manufacturing a semiconductor device such as an integrated circuit (IC) or a large-scale integration (LSI). These apparatuses have a stage for holding a wafer in place with high accuracy in a vacuum processing chamber.

An example of such a stage is a substrate holding device that clamps a wafer with an electrostatic chuck mounted on a baseplate. Such a substrate holding device may be structured such that a gas supply path for cooling a wafer is provided, for example. Gas is supplied to the surface of an electrostatic chuck via a gas flow passage inside the baseplate and via through holes and a porous material containing spherical ceramic particles provided in the electrostatic chuck, for example.

When a substrate holding device provided with an electrostatic chuck is used in a plasma etching apparatus, a problem may arise that abnormal electrical discharge occurs at the electrostatic chuck during the wafer etching process, thereby destroying the wafer or the plasma etching apparatus.

Provision of a porous material containing spherical ceramic particles as described above is an effective counter measure against abnormal electrical discharge. However, this arrangement does not sufficiently reduce the cubic volume of space inside a gas hole, so that further improvement may be desirable.

Accordingly, there may be a need to further reduce the likelihood of abnormal electrical discharge at an electrostatic chuck.

RELATED-ART DOCUMENTS

Patent Document

[Patent Document 1] Japanese Laid-open Patent Publication No. 2017-218352

SUMMARY

According to an aspect of the embodiment, an electrostatic chuck includes a base having a surface on which an object is to be placed, and a through hole extending through the base, wherein a porous material containing angular ceramic particles is disposed in the through hole.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

Figure 1:
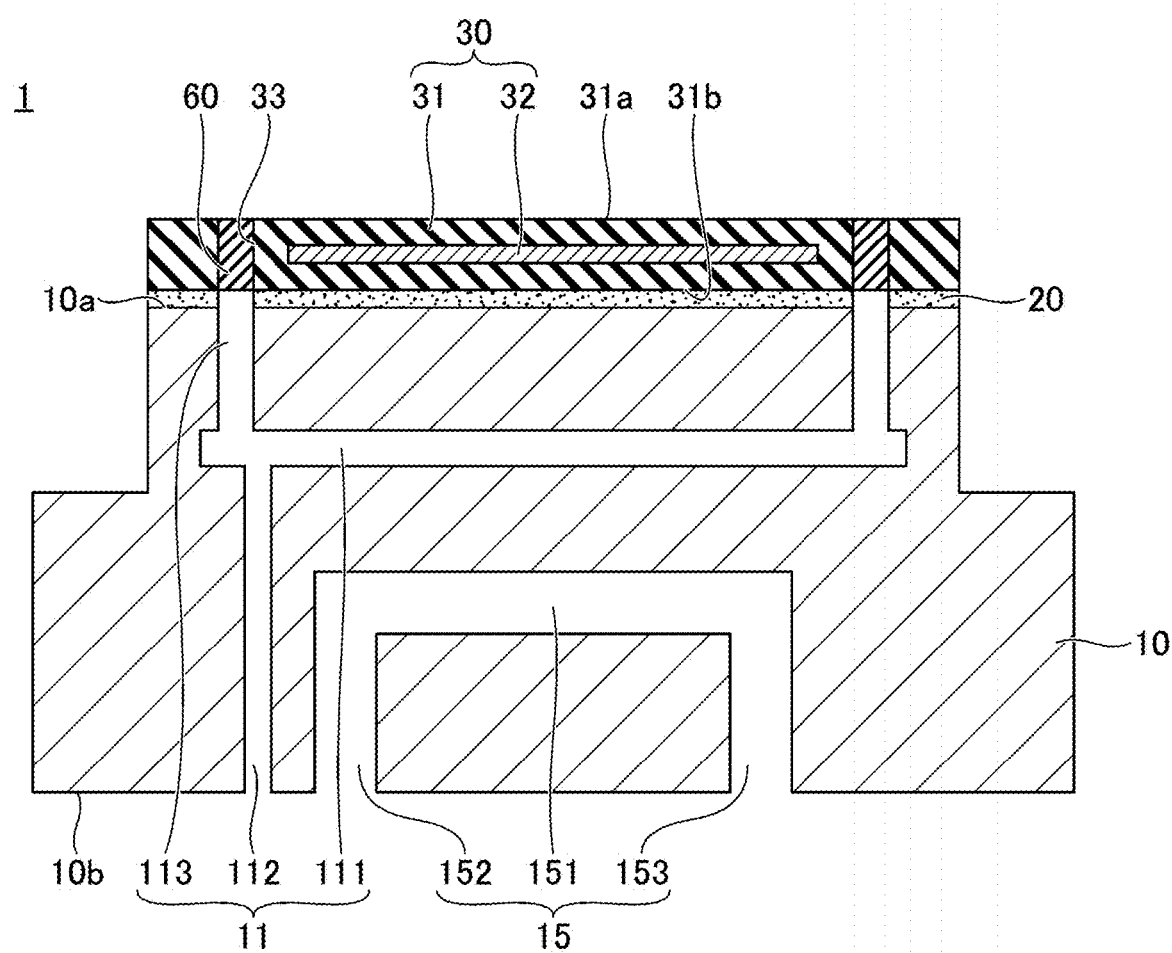
FIG. 1 is a cross-sectional view providing a schematic illustration of a substrate holding device according to an embodiment.

In the following, embodiments will be described by referring to the accompanying drawings. In the drawings, the same elements are referred to by the same references, and a duplicate description thereof may be omitted.

FIG. 1 is a cross-sectional view providing a schematic illustration of a substrate holding device according to an embodiment. As illustrated in FIG. 1, a substrate holding device 1 includes a baseplate 10, an adhesive layer 20, and an electrostatic chuck 30 as main components.

The baseplate 10 serves to support the electrostatic chuck 30. The thickness of the baseplate 10 may approximately be in a range of 20 mm to 40 mm, for example. The baseplate 10 may be made of aluminum, for example, which may also serve as an electrode or the like for controlling plasma. Supplying a predetermined high-frequency electric power to the baseplate 10 enables the control of energy with which generated plasma ions impact a wafer held on the electrostatic chuck 30, thereby achieving an efficient etching process.

The baseplate 10 has a gas supply section 11 provided therein that supplies a gas for cooling a wafer held on the electrostatic chuck 30. The gas supply section 11 includes a gas passage 111, a gas injecting section 112, and gas ejecting sections 113.

The gas passage 111 is a hole formed in a ring shape inside the baseplate 10, for example. The gas injecting section 112 is a hole whose one end communicates with the gas passage 111 and whose opposite end is an opening situated at a lower surface 10b of the baseplate 10. Through the gas injecting section 112, an inert gas (e.g., He, Ar, or the like) is introduced into the gas passage 111 from the outside of the substrate holding device 1. The gas ejecting sections 113 are holes, each of which has one end thereof communicating with the gas passage 111 and the other end thereof being an opening situated at an upper surface 10a of the baseplate 10 and connected to a hole extending through the adhesive layer 20. The gas ejecting sections 113 discharge the inert gas introduced into the gas passage 111. The gas ejecting sections 113 are scattered across the upper surface 10a of the baseplate 10 in a plan view. The number of gas ejecting sections 113, which can properly be determined according to need, may approximately be few tens to few hundreds, for example.

A plan view refers to a view of an object taken in the direction perpendicular to a support surface 31a of a base 31, and a plane shape refers to the shape of an object as viewed in the direction perpendicular to the support surface 31a of the base 31.

The baseplate 10 has a cooling mechanism 15 provided therein, for example. The cooling mechanism 15 includes a coolant passage 151, a coolant introducing section 152, and a coolant discharging section 153. The coolant passage 151 is a hole formed in a ring shape inside the baseplate 10, for example. The coolant introducing section 152 is a hole whose one end communicates with the coolant passage 151 and whose opposite end is an opening situated at the lower surface 10b of the baseplate 10. Through the coolant introducing section 152, coolant (e.g., coolant water, Galden, or the like) is introduced into the coolant passage 151 from the outside of the substrate holding device 1. The coolant discharging section 153 is a hole whose one end communicates with the coolant passage 151 and whose opposite end is an opening situated at the lower surface 10b of the baseplate 10. The coolant discharging section 153 discharges the coolant introduced into the coolant passage 151.

The cooling mechanism 15 is connected to a coolant control apparatus (not shown) provided outside the substrate holding device 1. The coolant control apparatus (not shown) feeds coolant into the coolant passage 151 through the coolant introducing section 152, and receives the coolant discharged from the coolant discharging section 153. Circulating the coolant through the cooling mechanism 15 to cool the baseplate 10 causes a wafer held on the electrostatic chuck 30 to be cooled.

The electrostatic chuck 30 serves to attract and hold a wafer, which is an object to be held. The plane shape of the electrostatic chuck 30 may be circular, for example. The diameter of the wafer that is an object to be held by the electrostatic chuck 30 may be 8, 12, or, 18 inches, for example.

The electrostatic chuck 30 is disposed on the upper surface 10a of the baseplate 10 through the adhesive layer 20. A silicone-based adhesive, for example, may be used as the adhesive layer 20. The thickness of the adhesive layer 20 is approximately in a range of 0.1 mm to 1.0 mm, for example. The adhesive layer 20 bonds the baseplate 10 to the electrostatic chuck 30 and reduces the stress caused by the difference in thermal expansion coefficients between the ceramic electrostatic chuck 30 and the aluminum baseplate 10.

The electrostatic chuck 30 includes the base 31 and an electrostatic electrode 32. The upper surface of the base 31 is the support surface 31a for supporting an object to be held. The electrostatic chuck 30 may be a Johnsen-Rahbeck electrostatic chuck. The electrostatic chuck 30 may alternatively be a Coulomb-type electrostatic chuck.

The base 31 is made of a dielectric material, which may be a ceramic such as aluminum oxide ($Al_2O_3$), aluminum nitride (AlN), or the like. The base 31 may contain, as auxiliary agent, oxides of two or more elements selected from silicon (Si), magnesium (Mg), calcium (Ca), aluminum (Al), and yttrium (Y), for example. The thickness of the base 31 may approximately be in a range of 5 mm to 10 mm. The relative permittivity of the base 31 at 1 kHz may approximately be in a range of 9 to 10.

The electrostatic electrode 32 is a thin-film electrode that is embedded in the base 31. The electrostatic electrode 32 is coupled to a power supply (not shown) provided separately from the substrate holding device 1. Upon receiving a predetermined voltage from the power supply, the electrostatic electrode 32 generates an electrostatic-based attracting force with respect to a wafer. This causes the wafer to be attracted to and held on the support surface 31a of the base 31 of the electrostatic chuck 30. The attracting force increases as the voltage applied to the electrostatic electrode 32 increases. The electrostatic electrode 32 may have either a monopole structure or a dipole structure. Tungsten, molybdenum, or the like may be used as the material of the electrostatic electrode 32.

A heating element may be provided inside the base 31 to generate heat by receiving voltage from outside the substrate holding device 1 to thereby increase the temperature of the support surface 31a of the base 31 to a predetermined temperature.

Gas holes 33, which are through holes extending through the base 31 to expose the ends of the gas ejecting sections 113, are provided at the positions corresponding to the positions of the gas ejecting sections 113 of the base 31. The gas holes 33 communicate with the gas supply section 11, so that a gas is supplied to the support surface 31a via the gas supply section 11 and the gas holes 33. The gas holes 33 have a porous material 60 disposed therein. The porous material 60 contains angular ceramic particles and mixed oxides that bond and integrate the angular ceramic particles.

Figure 2:
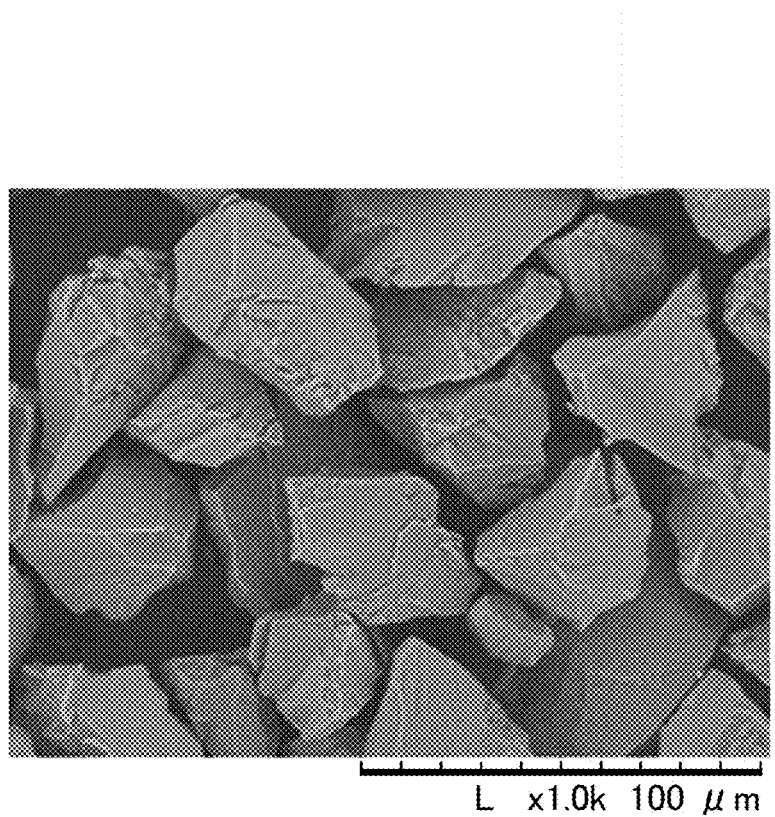
FIG. 2 is an SEM image of coarse alumina particles presented as an example of angular ceramic particles.

FIG. 2 is an SEM (scanning electron microscope) image of coarse alumina particles presented as an example of angular ceramic particles. As illustrated in FIG. 2, unlike a spherical ceramic particle, an angular ceramic particle has at least one sharp point, and is a polyhedron-like structure whose overall shape is angular. As the angular ceramic particles, a material used as an abrasive powder in the semiconductor manufacturing process and having an appropriate particle size distribution or the like may be used, for example. A preferred example of angular ceramic particles is coarse alumina particles. As an alternative to alumina particles, a high-melting point inorganic material, such as zirconium dioxide ($ZrO_2$) or silicon carbide (SiC), may be used.

The particle size of angular ceramic particles is preferably greater than or equal to 10 μm and less than or equal to 100 μm, and more preferably greater than or equal to 10 μm and less than or equal to 50 μm. In the example illustrated in FIG. 2, the average particle size of angular ceramic particles is approximately 30 μm. The particle size of an angular ceramic particle refers to the length of the longest length of the particle. Preferably, the angular ceramic particles contained in the porous material 60 account for a weight ratio of greater than or equal to 80 wt % and less than or equal to 97 wt %.

Mixed oxides adhere to a portion of the outer surface of angular ceramic particles to support them. The mixed oxides are comprised of oxides of two or more elements selected from silicon (Si), magnesium (Mg), calcium (Ca), aluminum (Al), and yttrium (Y), for example.

Pores are formed inside the porous material 60. The pores communicate with the outside, so that a gas can pass from the lower side of the porous material 60 to the upper side thereof. The porosity of pores formed in the porous material 60 is preferably in a range of 20% to 50% of the total cubic volume of the porous material 60. The inner surface of the pores is constituted by portions of the outer surfaces of angular ceramic particles and the mixed oxides.

In the case in which the base 31 is formed of aluminum oxide, the base 31 preferably contains oxides of two or more elements selected from silicon, magnesium, calcium, and yttrium as additional components. The composition ratio of oxides of two or more elements selected from silicon, magnesium, calcium, and yttrium contained in the base 31 is preferably set equal to the composition ratio of oxides of two or more elements selected from silicon, magnesium, calcium, and yttrium contained as the mixed oxides in the porous material 60.

Use of the same composition ratio of oxides for both the base 31 and the mixed oxides of the porous material 60 ensures that no intermixing of elements occurs at the time of sintering the porous material 60, thereby making it possible to secure the planarity of the interface between the base 31 and the porous material 60. Further, the resultant thermal expansion coefficients of the base 31 and the porous material 60 are comparable to each other, so that damage caused by stress or the like can be avoided.

[Method of Making Substrate Holding Device]

FIGS. 3A through 3C and FIGS. 4A through 4C are drawings illustrating examples of the process steps of making the substrate holding device of the present embodiment. These figures illustrate the base 31 and the like of FIG. 1 in a simplified fashion. In the following, the process steps and the like of forming the gas holes 33 and the porous material 60 in the electrostatic chuck 30 will mainly be described with reference to FIGS. 3A through 3C and FIGS. 4A through 4C.

Figure 3A:
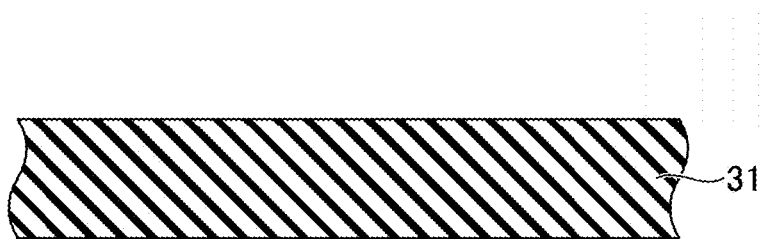
FIGS. 3A through 3C are drawings illustrating examples of process steps for making the substrate holding device according to the embodiment.
Figure 3B:

As illustrated in FIG. 3A, the base 31 having the electrostatic electrode 32 (not shown in FIG. 3A) embedded therein may be produced by a conventional manufacturing procedure including a step of forming vias through a green sheet, a step of filling the vias with conductive paste, a step of forming a pattern to become an electrostatic electrode, a step of laminating another green sheet over the noted green sheet for calcination, and a step of planarizing the surfaces. Then, as illustrated in FIG. 3B, gas holes 33 extending through the base 31 are formed. The gas holes 33 may be made by drilling, for example.

Figure 3C:
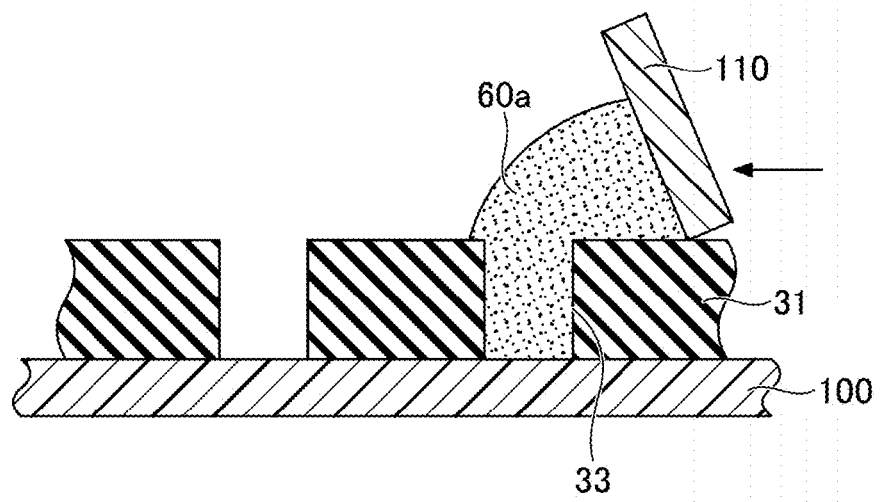

As Illustrated in FIG. 3C, the base 31 is disposed on a stage 100 with a release sheet (not shown) intervening therebetween. A paste 60a, which is the precursor of the porous material 60, is prepared. A squeegee 110 is moved horizontally to sweep the paste 60a, thereby filling the gas holes 33 of the base 31 with the paste 60a. In so doing, pressure may be applied to the paste 60a to increase the amount of injection. The paste 60a, which is the precursor of the porous material 60, contains angular ceramic particles at a predetermined weight ratio, for example. The rest of the paste 60a contains oxides of two or more elements selected from silicon, magnesium, calcium, aluminum, and yttrium, as well as an organic binder and a solvent, for example. As the organic binder, polyvinyl butyral may be used, for example. An alcohol, for example, may be used as the solvent.

Figure 4A:
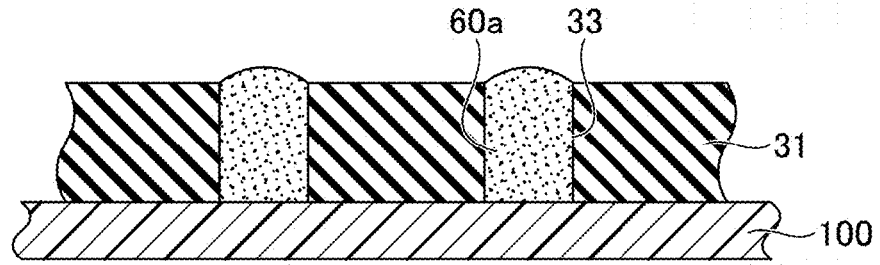
FIGS. 4A through 4C are drawings illustrating examples of process steps for making the substrate holding device according to the embodiment.

FIG. 4A illustrates the result of the above-noted arrangement, in which the paste 60a has been injected into the gas holes 33 of the base 31. The base 31 has already been sintered, so that there is no risk of contraction or the like occurring in the subsequent sintering process that would change the size or position of the gas holes 33. Further, even in the case in which the diameter of the gas holes 33 is as small as 3 mm or less, the gas holes 33 can be easily filled with the paste 60a.

Figure 4B:
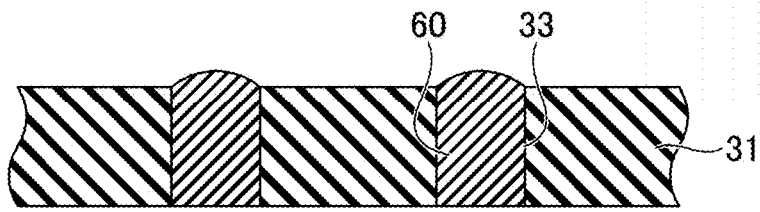

As illustrated in FIG. 4B, the paste 60a is sintered at a temperature of approximately 1400° C., which is approximately 100° C. lower than the sintering temperature of the base 31, thereby forming the porous material 60 in the gas holes 33 of the base 31. The composition ratio of any of silicon, magnesium, calcium, and yttrium is set to be the same for the base 31 and the mixed oxides of the paste 60a. With this arrangement, the sintering process does not cause the intermixing of elements between the base 31 and the paste 60a, thereby making it possible to ensure the planarity of the interface between the inner wall of the gas holes 33 of the base 31 and the porous material 60.

Figure 4C:
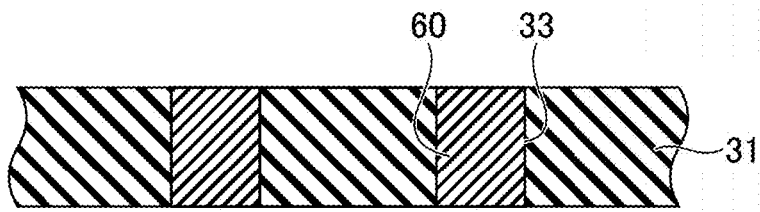

The porous material 60 protrudes upwardly from the upper end of the gas holes 33 of the base 31. As illustrated in FIG. 4C, the upper surfaces of the base 31 and the porous material 60 are subjected to surface grinding, which makes the upper surface of the base 31 and the upper surface of the porous material 60 flat and flush with each other. If necessary, surface grinding may also be applied to the lower surfaces of the base 31 and the porous material 60. Through the process steps described above, the structure in which the porous material 60 is disposed in the gas holes 33 of the base 31 is obtained.

Subsequently, the baseplate 10 having the cooling mechanism 15 and the like provided therein is arranged, and an adhesive layer 20 (uncured) is formed on the baseplate 10. The base 31 illustrated in FIG. 4C is then placed on the baseplate 10 with the adhesive layer 20 intervening therebetween, followed by curing the adhesive layer 20. With the process steps described above, the substrate holding device 1 illustrated in FIG. 1 is completed in final form.

Figure 5A:
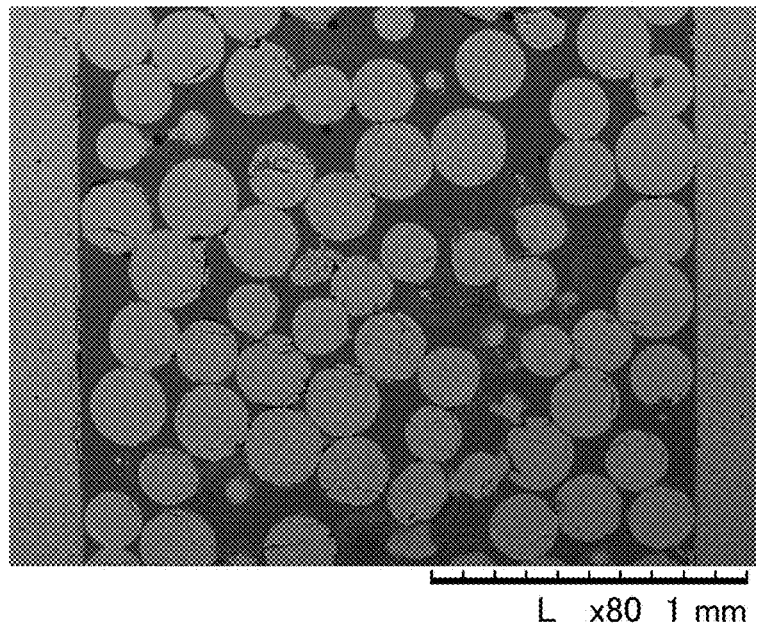
FIGS. 5A and 5B are SEM images for comparing spherical ceramic particles and angular ceramic particles.
Figure 5B:
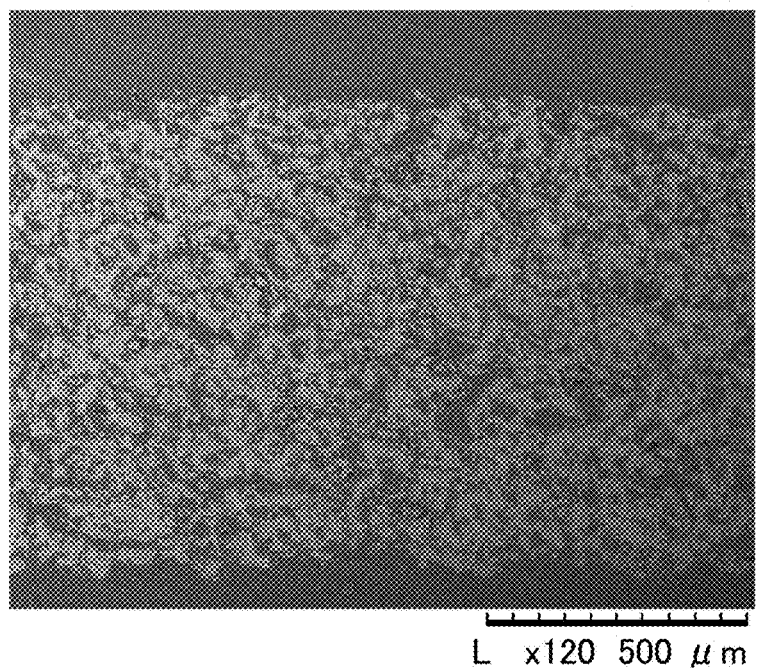

In the following, the advantages of the substrate holding device 1 will be described by referring to a comparative example. FIG. 5A is an SEM image of a comparative example structure which is made by injecting spherical ceramic particles into a gas hole. FIG. 5B is an SEM image of a gas-hole structure of the first embodiment which is made by injecting angular ceramic particles into a gas hole. Comparison of FIG. 5A and FIG. 5B reveals that, despite discrepancies in size, the amount of spaces is clearly smaller in FIG. 5B than in FIG. 5A. As is shown, filling a gas hole with angular ceramic particles reduces the overall volume of spaces compared with the use of spherical ceramic particles.

In the case of a hollow structure without spherical ceramic particles or angular ceramic particles injected into gas holes, exposure of the electrostatic chuck to a dense plasma environment causes an abnormal discharge to be triggered in the gas holes, which results in damage to a wafer mounted on the base and to the electrostatic chuck. Abnormal discharge can be mitigated to some extent by filling the gas holes with spherical ceramic particles, but the use of spherical ceramic particles do not sufficiently reduce the total volume of spaces in the gas holes due to the nature of their spherical shape.

In contrast, filling the gas holes with angular ceramic particles significantly reduces the overall volume of spaces as illustrated in FIG. 5B because angular ceramic particles tend to come closer to each other than spherical ceramic particles do. Consequently, abnormal discharge is significantly reduced.

Figure 6:
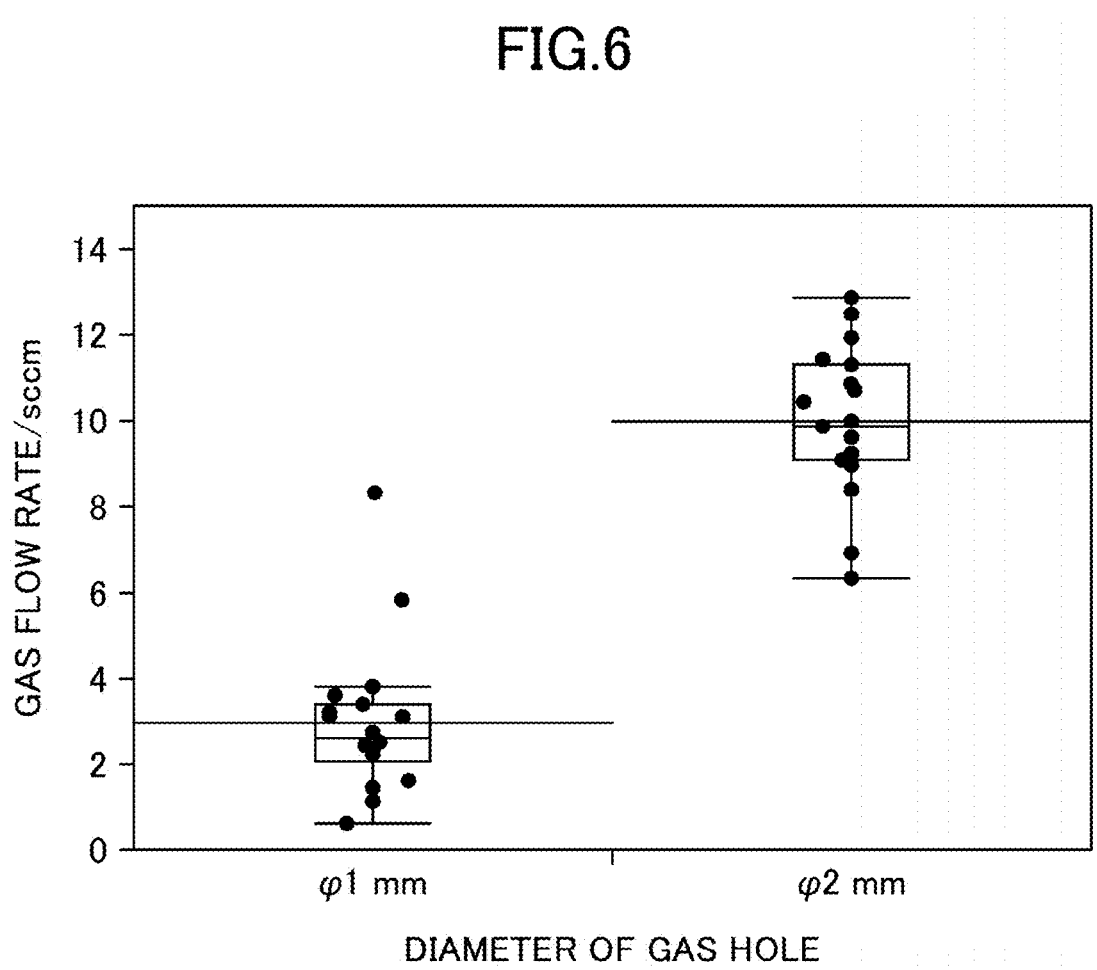
FIG. 6 is a drawing illustrating the results of an experiment showing the relationship between the diameter of a gas hole and the gas flow rate.

If there is no space in a gas hole, a gas cannot pass through the gas hole, which thus fails to achieve its intended purpose. However, a gas hole filled with angular ceramic particles still have a proper amount of spaces, and thus properly functions as a gas passage. FIG. 6 illustrates the results of an experiment in which the relationship between the diameter of a gas hole and the gas flow rate was measured. 18 gas holes with a diameter of 1 mm were formed through a base. Each gas hole was filled with angular ceramic particles having an average particle size of approximately 30 μm. The flow rate of a gas flowing through each gas hole was measured. Further, 18 gas holes with a diameter of 2 mm were formed through a base. Each gas hole was filled with angular ceramic particles having an average particle size of approximately 30 µm. The flow rate of a gas flowing through each gas hole was measured.

As illustrated in FIG. 6, with the gas holes having a diameter of 1 mm, the gas flow rate was approximately 3 sccm on average. With the gas holes having a diameter of 2 mm, the gas flow rate was approximately 10 sccm on average. Both figures are satisfactory as the gas flow rate of a gas hole used in an electrostatic chuck. Further, because there is a correlation between the diameter of a gas hole and the gas flow rate, it is easy to design a gas hole achieving a desired gas flow rate.

According to at least one embodiment, the likelihood of abnormal electrical discharge at an electrostatic chuck is further reduced.

The object to be held on the substrate holding device is not limited to a semiconductor wafer (i.e., silicon wafer or the like), and may as well be a glass substrate or the like that is used in the process of manufacturing a liquid crystal display panel or the like, for example.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the scope of the invention.

What is claimed is:

1. An electrostatic chuck comprising:
   a base having a surface on which an object is to be placed; and
   a through hole extending through the base,
   wherein a porous material containing angular ceramic particles is disposed in the through hole, and
   wherein the porous material includes oxides of two or more elements in addition to the angular ceramic particles, the oxides of two or more elements adhering to a portion of an outer surface of the angular ceramic particles to support the angular ceramic particles, and the oxides of two or more elements bonding and integrating the angular ceramic particles.

2. The electrostatic chuck as claimed in claim 1, wherein the base contains a ceramic oxide, one of the oxides of two or more elements is same as the ceramic oxide.

3. The electrostatic chuck as claimed in claim 2, wherein the ceramic oxide is alumina.

4. The electrostatic chuck as claimed in claim 1, wherein the base contains oxides that are the same as the oxides of two or more elements, and
   wherein a composition ratio of the oxides in the base is identical to a composition ratio of the oxides of two or more elements in the porous material.

5. The electrostatic chuck as claimed in claim 4, wherein the two or more elements are selected from silicon, magnesium, calcium, aluminum, and yttrium.

6. The electrostatic chuck as claimed in claim 1, wherein the angular ceramic particles are coarse alumina particles.

7. The electrostatic chuck as claimed in claim 1, wherein a particle size of the angular ceramic particles is greater than or equal to 10 µm and less than or equal to 100 µm.

8. A substrate holding device, comprising:
   a baseplate having a gas supply section provided therein; and
   the electrostatic chuck of claim 1 disposed on the baseplate, wherein
   the through hole communicates with the gas supply section, and
   a gas is supplied to the surface of the base through the gas supplying section and the through hole.

* * * * *